(12) United States Patent
Nagahama et al.

(10) Patent No.: US 6,909,092 B2
(45) Date of Patent: Jun. 21, 2005

(54) ELECTRON BEAM APPARATUS AND DEVICE MANUFACTURING METHOD USING SAME

(75) Inventors: Ichirota Nagahama, Ibaraki (JP); Yuichiro Yamazaki, Tokyo (JP); Kenji Watanabe, Kanagawa (JP); Masahiro Hatakeyama, Kanagawa (JP); Tohru Satake, Kanagawa (JP); Nobuharu Noji, Kanagawa (JP)

(73) Assignees: Ebara Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/437,889

(22) Filed: May 15, 2003

(65) Prior Publication Data

US 2003/0213893 A1 Nov. 20, 2003

(30) Foreign Application Priority Data

May 16, 2002 (JP) .................................. 2002-141714

(51) Int. Cl.⁷ ........................... G01N 23/00; G01K 1/08
(52) U.S. Cl. ..................... 250/310; 250/306; 250/307; 250/397
(58) Field of Search ................................ 250/310, 397, 250/306, 307

(56) References Cited

U.S. PATENT DOCUMENTS

| 5,576,833 | A | | 11/1996 | Miyoshi et al. |
| 6,184,526 | B1 | * | 2/2001 | Kohama et al. ............ 250/310 |
| 6,265,719 | B1 | | 7/2001 | Yamazaki et al. |
| 6,333,510 | B1 | * | 12/2001 | Watanabe et al. ...... 250/559.57 |
| 6,498,345 | B1 | * | 12/2002 | Weimer et al. ............. 250/310 |

FOREIGN PATENT DOCUMENTS

| JP | 07-249393 | 9/1995 |
| JP | 11-132975 | 5/1999 |
| JP | 2002-216698 | 8/2002 |

OTHER PUBLICATIONS

Electron beam inspection system based on the projection imaging electron microscope, J. Vac. Sci. Technol. B, 19(6), Nov./Dec. 2001, p. 2852–2855.
Material for the 145th Study Meeting of Japan Society for the Promotion of Science, pp. 18–23 and 28–30 (translation attached).
Electronic Microscope, vol. 36, No. 1, 2001, p. 53–56 (translation attached).

* cited by examiner

Primary Examiner—John Lee
Assistant Examiner—Paul M. Gurzo
(74) Attorney, Agent, or Firm—Westerman, Hattori, Daniels and Adrian LLP (57) ABSTRACT

A defect inspecting apparatus is provided for generating a less distorted test image to reliably observe a surface of a sample for detecting defects thereon. The defect detecting apparatus comprises a primary electron beam source for irradiating a sample, electrostatic lenses for focusing secondary electrons emitted from the surface of the sample irradiated with the primary electron beam, a detector for detecting the secondary electrons, and an image processing unit for processing a signal from the detector. Further, a second electron source may be provided for emitting an electron beam irradiated to the sample, wherein the sample may be irradiated with the electron beam from the second electron source before it is irradiated with the primary electron beam from the first electron source for observing the sample. A device manufacturing method is also provided for inspecting devices under processing with high throughput using the defect detecting apparatus.

17 Claims, 8 Drawing Sheets

ELECTRON BEAM APPARATUS AND DEVICE MANUFACTURING METHOD USING SAME

BACKGROUND OF THE INVENTION

The present invention relates to a defect detecting apparatus which can effectively perform inspections and observations on a surface of a sample such as an evaluation on the structure thereof, an observation in an enlarged view, and an evaluation on materials, an electric conduction state and the like on the surface to detect defects on high density patterns having, for example, a minimum line width of 0.15 $\mu$m or less with high accuracy and high reliability, and a device manufacturing method which relies on the defect detecting apparatus to inspect patterns intermediate of a semiconductor device manufacturing process.

In the present invention, the word "mapping" as referred to in the mapping optics means that an electron beam is irradiated on a field of view ranging at least one dimension to form an image of the field of view. Description of the Related Art:

Conventionally, a known testing apparatus detects possible defects on a wafer or a substrate by irradiating the surface of the substrate with a scanning electron beam, obtaining wafer image data from detected secondary electrons emitted from the substrate, and comparing the image data of each die on the wafer with that of adjacent dies.

In a conventional SEM-based system as described above, and a system which simultaneously illuminates a wide area, such as a mapping projection system, an insulating material on the substrate is charged as a substrate under inspection is irradiated with an electron beam. However, if the substrate is overcharged, image data from detected secondary electrons emitted from the substrate undergoes distortions which cause the system to detect false defects (falsely reported defects), to produce obscure images, and to suffer from damages such as dielectric breakdown.

SUMMARY OF THE INVENTION

The present invention has been made to solve the problems found in the prior art as mentioned above, and it is an object of the invention to provide a defect detecting apparatus which is capable of generating a less distorted testing image to reliably observe a surface and detect defects thereon, and a device manufacturing method by which devices under processing are tested using the defect detecting apparatus with high throughput.

To achieve the above object, in one embodiment of the present invention, a mapping type defect detecting apparatus includes an electron source for irradiating a primary electron beam to the surface of a sample such as a wafer, an electro-optical mapping system for enlarging the image of the secondary electrons emitted from the surface of the sample to focus the enlarged secondary electrons on a detector, and an image processing system for processing a signal from the detector, wherein the electron beam incident on the sample is optimized to have beam energy in a range of 2 to 4 keV, thereby reducing a secondary electron emission efficiency from the sample to less than one. This causes the sample to be negatively charged to significantly reduce image distortions. Since reasonable conductivity occurs on the surface of the sample in this energy region when the sample is a mixture of a metal and an insulating material, no extreme potential difference will be produced by the charging between the metal and insulating material. It is therefore possible to form an image with less distortion and aberration when the secondary electrons emitted from the surface of the sample is focused on the detector through the optical mapping system.

It should be noted that the conductivity effect is insufficient with incident beam energy smaller than the range mentioned above, resulting in a failure in a sufficient reduction in distortion and aberration. On the other hand, the primary electron beam having the energy exceeding the aforementioned range is not suitable for inspection because devices could be damaged by an excessive Joule heat effect and damaging effect. Since it takes a few minutes for a conductivity effect to appear on the surface of a wafer, which will prevent a high-throughput process, a surface potential may be previously uniformed by such means as laser irradiation and secondary electron source, thereby achieving high throughput.

In regard to the conductivity effect, energy electrons are produced by cascaded collisions of the primary electron beams incident on the sample with atoms which make up the sample, resulting in the conductivity on the surface of the sample. In this event, the incident electron beam needs to have the energy on the order of 2 to 4 keV in order to produce sufficient energy electrons.

Alternatively, in order to provide the conductivity effect on the surface of the sample, the sample may be irradiated with electrons before it is irradiated with the electron beam for observation and analysis. In this event, a second electron source may be provided prior to irradiating the sample with an electron beam. Preferably, the potential is balanced on the surface of the sample before the sample is moved to the measuring location, where the sample is irradiated with the primary electron beam from the first electron source to emit secondary electrons from the surface of the sample, and the secondary electrons are led to the detector by the electro-optical system for observation and measurement. In this event, a resulting electron beam has less aberration and distortion because the image is produced from the secondary electrons emitted from the surface of the sample which has become stable in potential due to the conductivity given to the sample.

In addition, the sample may be irradiated simultaneously with a laser or an electron beam to increase the conductivity effect on the surface of the sample, to make the potential more uniform on the surface of the sample, as compared with the irradiation of the electron beam alone, and to detect an electron beam with less aberration and distortion.

For increasing the throughput for inspecting the surface, the secondary electrons emitted from the surface of the sample can be detected by an optical mapping system. Since the use of the optical mapping system permits wide-area simultaneous detection of secondary electrons two-dimensionally emitted from the surface of the sample, without any need for a scanning time such as an SEM, a two-dimensional electron image can be rapidly detected. Taking advantage of this feature, a wafer can also be inspected for defects at a high throughput, by way of example. A device manufacturing method can be implemented for inspecting a wafer under processing for defect inspection by using the foregoing method and apparatus.

Thus, according to a first aspect of the present invention, an electron beam apparatus includes a primary electron beam source for irradiating a sample with the primary electron beam, an optical mapping system for focusing secondary electrons emitted from the surface of the sample irradiated with the primary electron beam, a detector for capturing the secondary electrons, and an image processing system for processing a signal from the detector.

The primary electron beam having beam energy in a range of 2 to 4 keV can negatively charge an insulating material on the surface of the sample to reduce overcharging. The optical mapping system has a resolution equal to or less than 0.1 μm, and a maximum image height equal to or larger than 50 μm in the field of view.

The electron beam apparatus further includes separating device for separating the primary electron beam from the secondary electrons. The separating device is, for example, an ExB filter.

The detector includes a line sensor. The line sensor may be a TDI (Time Delayed Integration line sensor).

The electron beam apparatus further includes second electron beam source for illuminating the sample with the electron beam before the sample is irradiated with the primary electron beam from the first irradiating means.

The electron beam from the second electron beam source has beam energy in a range of 2 to 4 keV.

The electron beam apparatus further includes a coherent light source lamp or a laser light source for irradiating the sample with coherent light or laser light.

The coherent light from the light source lamp has a wavelength band of 300 to 600 nm or less. The coherent light or laser light from the light source lamp has an irradiation density equal to or larger than 1 W/cm$^2$.

According to a second aspect of the present invention, a device manufacturing method includes the step of inspecting a wafer under processing for defects using the electron beam apparatus mentioned above.

DESCRIPTION OF THE EMBODIMENTS

Figure 1:
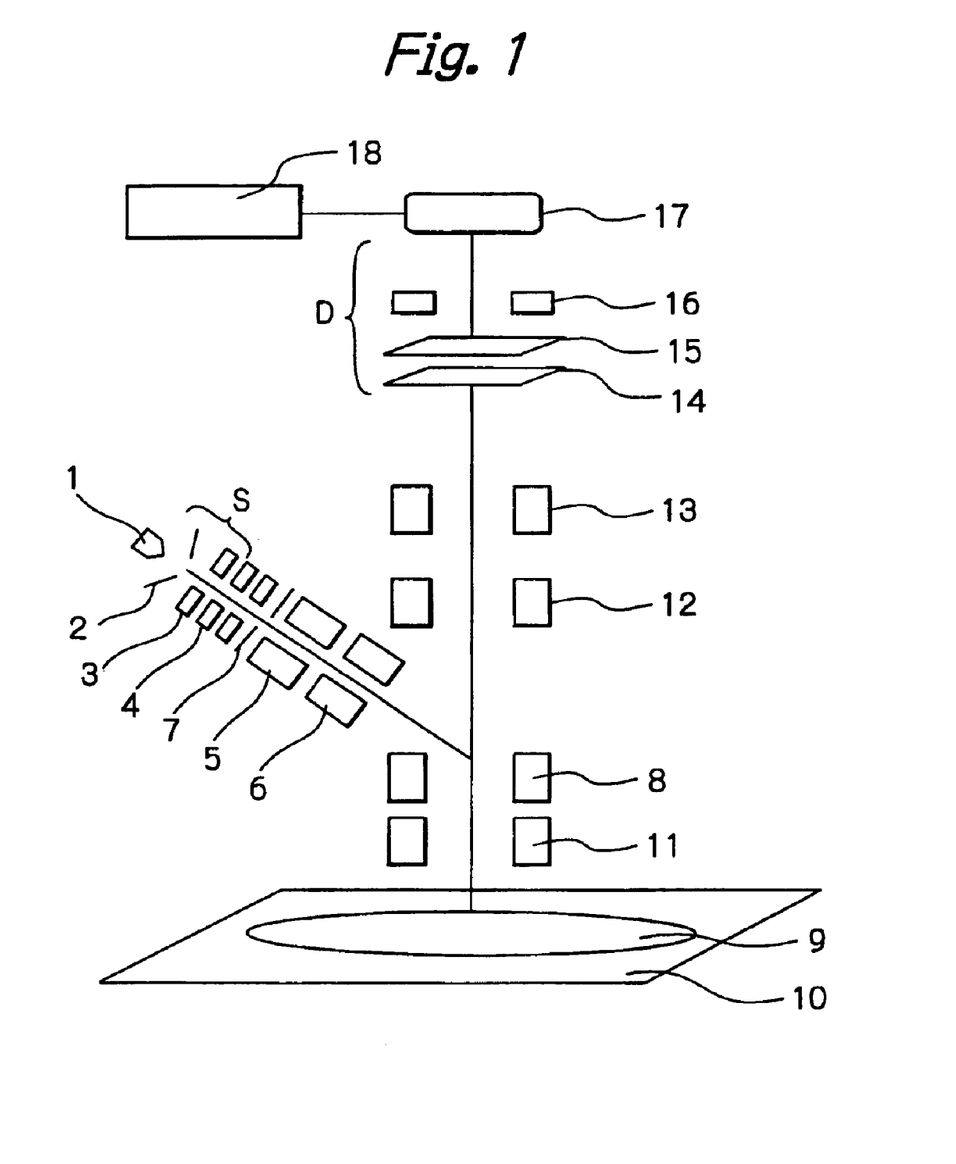
FIG. 1 is a diagram generally illustrating the configuration of a first embodiment of an electron beam apparatus according to the present invention.

In the following, several embodiments of an electron beam apparatus according to the present invention will be described in detail with reference to FIGS. 1 to 8. FIG. 1 generally illustrates a first embodiment of an electron beam apparatus according to the present invention. The illustrated electron beam apparatus comprises an electron source S which has a cathode 1, a Wehnelt electrode 2 and an anode 3. A primary electron beam emitted from the electron source S is enlarged by three electrostatic lenses, 4, 5, 6, and reshaped by a square aperture plate 7 such that its cross section is formed into a square. The primary electron beam thus reshaped travels in a direction which is bent toward a sample 9 by an ExB filter 8. In this way, the primary electron beam is controlled in terms of an area of the sample 9 irradiated therewith, and irradiation energy, and is irradiated to the sample 9 with a beam of 50 μm×200 μm and irradiation energy of 3 keV. The sample 9 may be a silicon wafer having a diameter of 8 to 12 inches, for example, which is formed with circuit patterns in the midpoint of an LSI manufacturing process, and is placed on an x-y-θ stage 10.

Secondary electrons emitted from the sample 9 irradiated with the primary electron beam are enlarged by a factor of 50 to 500 by a first electrostatic lens (control lens: CL) 11, a second electrostatic lens (transfer lens: TL) 12 and a third electrostatic lens (projection lens: PL) 13, and focused on a detector D. Preferably, a mapping detection system has a resolution of 0.1 μm or less, and a maximum image height of 200 μm or less in the field of view. The detector D comprises a microchannel plate 14 for multiplying secondary electrons incident thereon; a fluorescent plate 15 for converting the secondary electrons output from the microchannel plate 14 into luminescence; a relay lens 16 for relaying the luminescence emitted from the fluorescent plate 15; and a TDI (Time Delayed Integration) 17 for detecting the two-dimensional light output through the relay lens 16 as an image. Alternatively, an appropriate line sensor may be used instead of the TDI.

In this way, the secondary electrons multiplied by the microchannel plate 14 is converted into two-dimensional light by the fluorescent plate 15, and the two-dimensional light is led by the relay lens 16 to the TDI 17 which acquires the light as image data and forms an image of the sample. Since the TDI 17 can output signals representative of two-dimensional images generated along the direction of scan (the direction of the motion of the stage) due to continuous travel of the wafer on the x-y-θ stage 10, the image signals can be captured at a high speed. The image signals from the TDI 17 are processed by an image processing unit 18 for comparing an image with adjacent one to form an electron image, thereby detecting defects for classification and discrimination. In this way, defective regions are stored for detection, classification and discrimination of defects, and fed back for management of the manufacturing process.

Assume herein that the sample 9 under inspection is a silicon wafer which includes a pattern structure on the surface in the middle of a semiconductor circuit manufacturing process. For determining the presence or absence of defects such as debris, defective conduction, defective pattern and the like, determining the state of the defects, and classifying the defects by type, it is possible to irradiate the primary electron beam to the surface of the sample 9 to detect the secondary electrons emitted from the surface of the sample 9 for inspection.

Such a pattern under inspection occasionally has, particularly in the case of a device wiring process, a surface structure which consists of complex materials such as a mixture of a metal such as tungsten, aluminum, copper or the like and an insulating material such as SiO$_2$, Si$_3$N$_4$, SiN or the like. In this pattern, a large difference in the surface potential is produced between a metal and an insulator because the metal is different from the insulating material in the secondary electron emission characteristic or coefficient.

This can result in an extremely large potential difference produced at a pattern boundary, which would prevent secondary electrons from being emitted from the surface and cause arc discharge. Considering this, such a difference in potential may previously be reduced by illuminating the surface by a secondary electron source.

Figure 2:
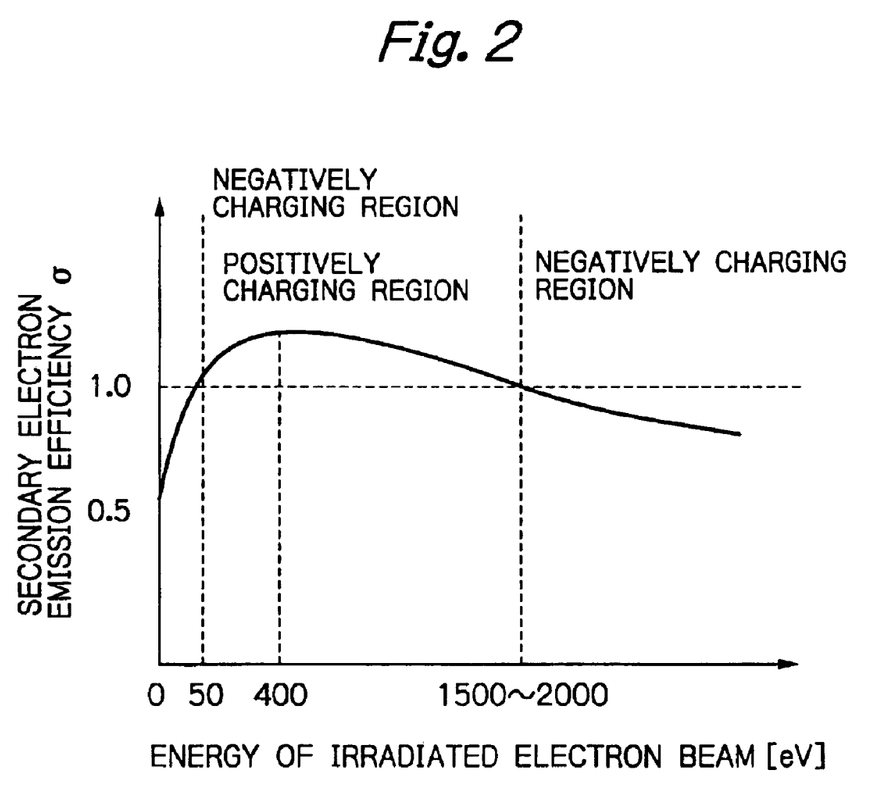
FIG. 2 is a graph showing the relationship between the energy of an irradiated electron beam and an emission efficiency a of secondary electrons when the electron beam is irradiated to an insulating material made of SiO$_2$.

FIG. 2 is a graph showing the relationship between the energy of an irradiated electron beam and an emission efficiency σ of secondary electrons when the electron beam is irradiated to an insulating material made of $SiO_2$. It can be seen from this graph that more secondary electrons are emitted than incident electrons in a range where the emission efficiency σ is larger than one, i.e., with the irradiated electron beam having the energy in a range of 50 to 2000 eV, so that the surface of the insulating material is positively charged, and that the irradiated electron beam having the energy of 2 to 3 keV results in a reasonable conductivity effect on the surface of the insulating material, which negatively charges the surface of the insulating material, thereby reducing a difference in the surface potential between a metal and the insulating material. From this fact, a reduction in distortion and aberration can be achieved in the defect detecting apparatus illustrated in FIG. 1 by irradiating the sample 9 with a primary electron beam, emitted from the electron source, having the energy set to 2 to 3 keV, and leading secondary electrons emitted from the surface of the sample 9 by a lens system comprised of the three electrostatic lenses 11–13 for detection by the TDI 17.

Figure 3:
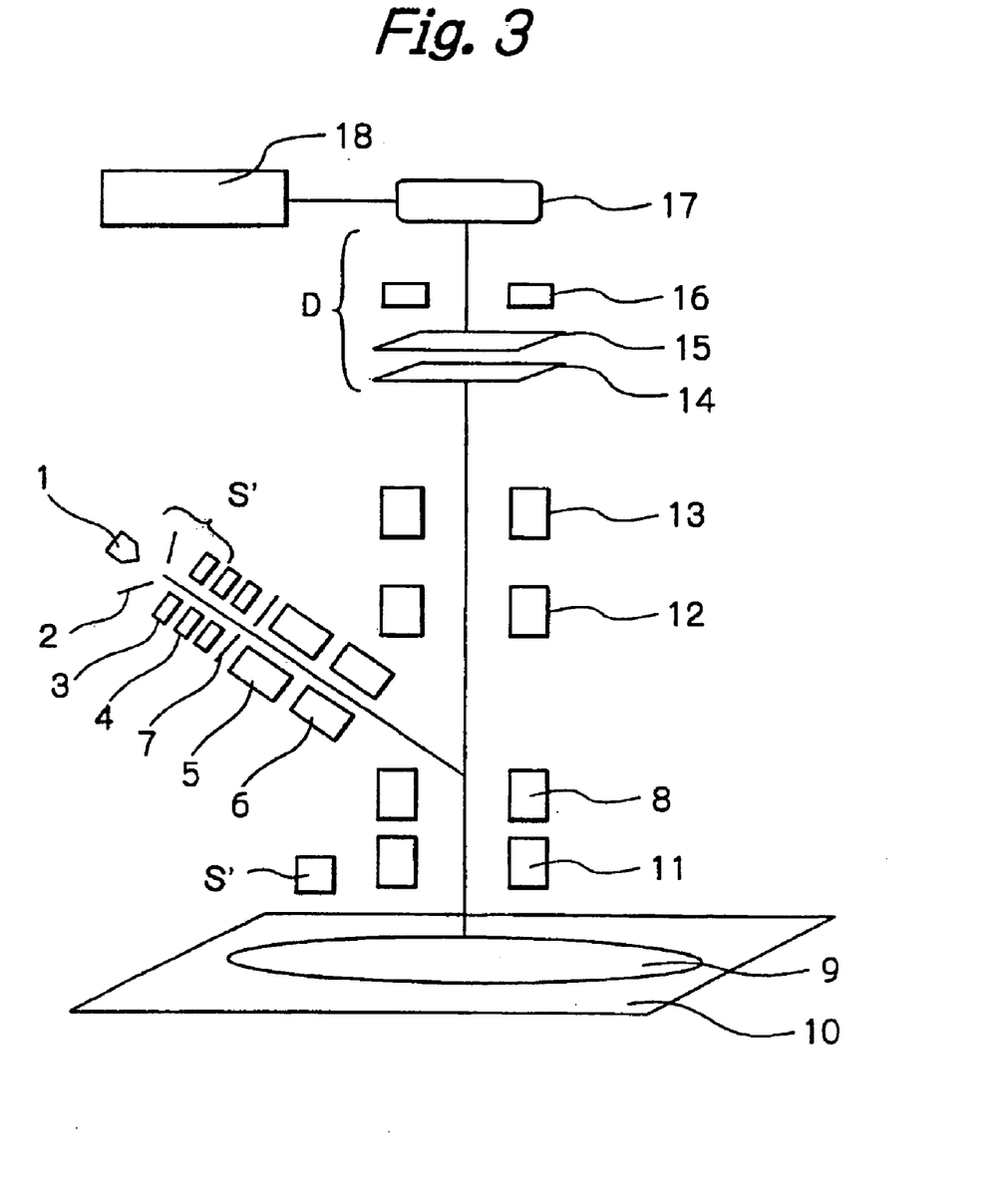
FIG. 3 is a diagram generally illustrating the configuration of a second embodiment of the electron beam apparatus according to the present invention.

FIG. 3 generally illustrates a second embodiment of the electron beam apparatus according to the present invention. As compared with the first embodiment illustrated in FIG. 1, the second embodiment differs in that a second electron source S' is provided in addition to the first electron source S. The second electron source S' is used to irradiate an electron beam to the surface of the sample 9 to produce a uniform potential on the surface of the sample 9 for the purpose of unifying the potential difference by electron beam irradiation, thereby enabling an image without distortion to be obtained. After the potential is unified on the surface of the sample 9, the sample 9 is moved to a measuring position and is irradiated with the primary electron beam from the first electron source S. Since the subsequent operation is the same as that previously described in connection with FIG. 1, description thereon is not repeated here.

The second electron source S' suitable for use in the second embodiment may comprise a tungsten filament type hot cathode source or a carbon nanotube type cold cathode source, a Wehnelt electrode 2 and an anode 3 in this order. Using nanotube could achieve a process without heat damage by filament heating. With this second electron source S', the primary electron beam can provide an irradiation region of 10 μm to 10 mm, for example, on the surface of the sample 9 by use of an aperture plate 7 for forming an irradiated area, in which case the irradiation energy can be controlled in a range of 0 to 4 keV, more preferably in a range of 2 to 4 keV.

Figure 4:
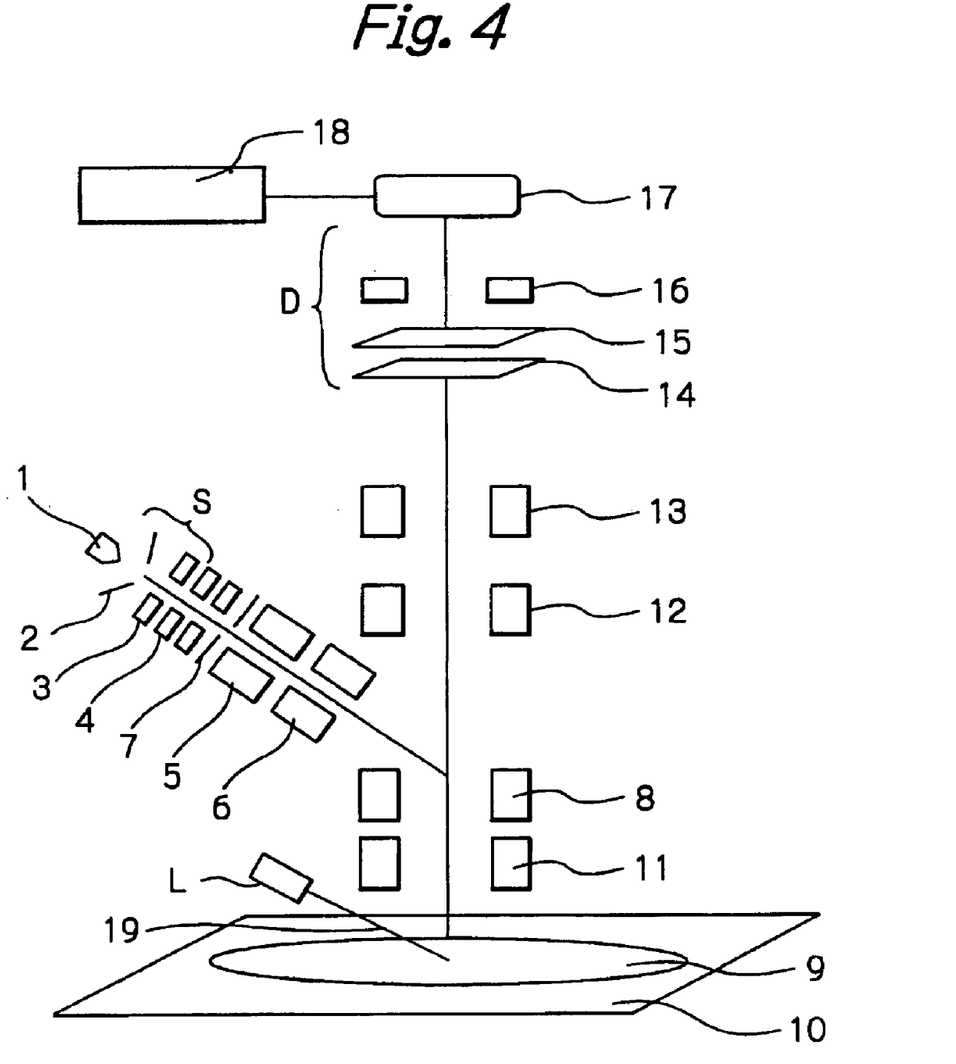
FIG. 4 is a diagram generally illustrating the configuration of a third embodiment of the electron beam apparatus according to the present invention.

FIG. 4 generally illustrates a third embodiment of the electron beam apparatus according to the present invention. As compared with the first embodiment illustrated in FIG. 1, the third embodiment differs in that a laser light source is provided in addition to the electron source S. The following description will be centered only on such differences. The rest of the third embodiment is the same as the first embodiment described in connection with FIG. 1, so that description thereon is not repeated.

The laser light source L operates together with the electron source S to irradiate the sample 9 with laser light 19 in addition to the primary electron beam. The irradiation of the sample 9 with the laser light 19 can increase the conductivity effect on the surface of the sample 9 to improve the difference in surface potential between the metal and insulating material.

The laser light source L used herein may be, for example, an He—Cd laser which preferably emits laser light at two wavelengths below 500 nm, specifically at 325 nm and 420 nm, and has an irradiation intensity of 2 $W/cm^2$ or less, more preferably 1 $W/cm^2$ or less, and an irradiating area of 1 mm in diameter. While the third embodiment illustrated in FIG. 4 employs only one laser light source, a plurality of laser light sources may be provided to irradiate the sample 9 with laser light emitted therefrom for increasing the irradiation intensity. Alternatively, the sample 9 may be irradiated with laser light from a plurality of laser light sources in symmetric directions to increase the efficiency.

Figure 5:
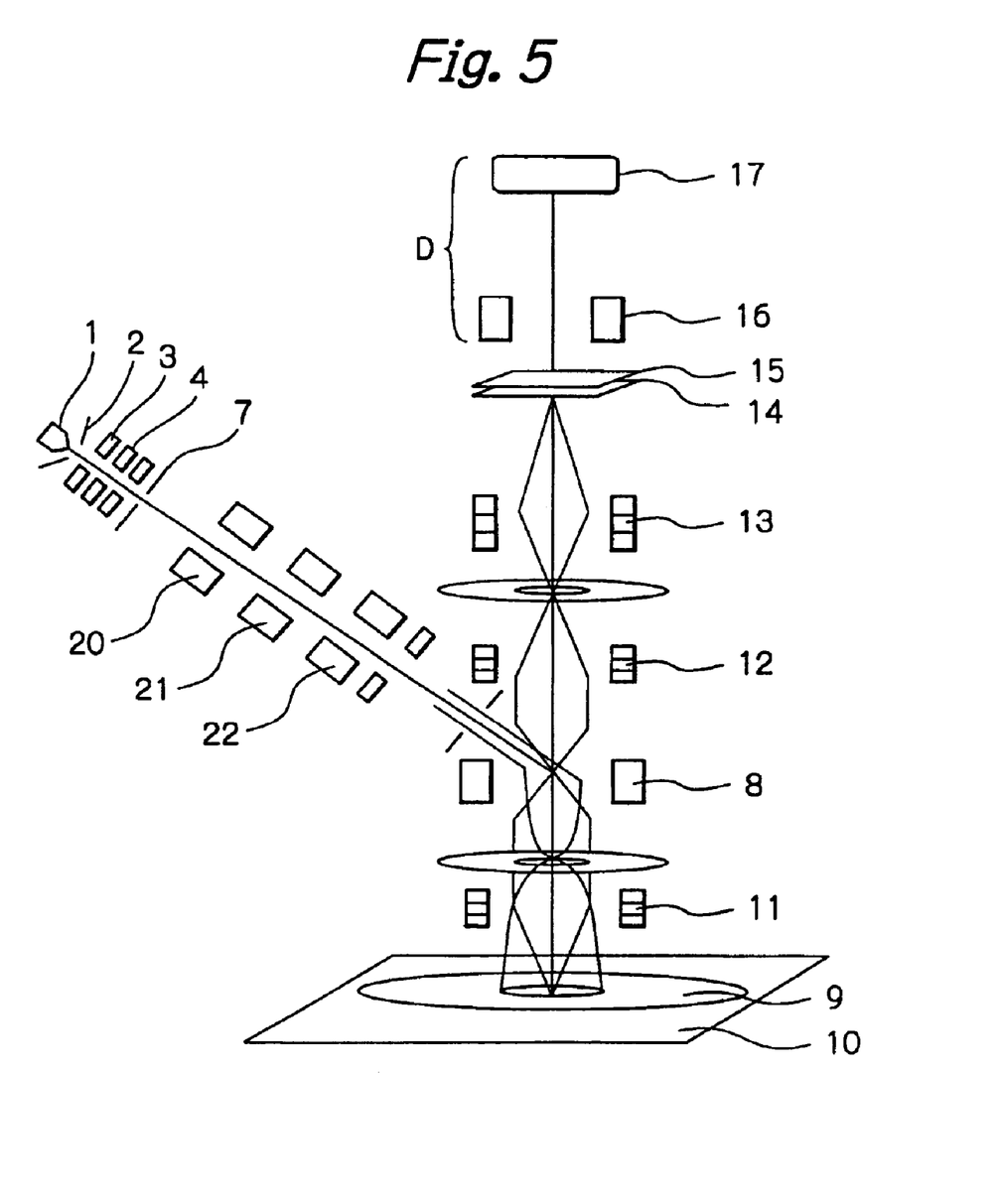
FIG. 5 is a diagram generally illustrating the configuration of a fourth embodiment of the electron beam apparatus according to the present invention.

FIG. 5 generally illustrates a mapping projection type inspecting apparatus which is a fourth embodiment of the defect detecting apparatus according to the present invention, where components identical or similar to those in the first embodiment illustrated in FIG. 1 are designated by the same reference numerals and letters.

In FIG. 5, a primary electron beam accelerated by an anode 3 and emitted from an electron source S is reshaped by an electrostatic lens 4 and a square aperture plate 7, and reduced by three quadruple lenses 20,21,22. The reduced primary electron beam is deflected by an ExB filter 8 and then focused on a deflection center plane of the filter, for example, in the shape of a square having a side of 1.25 mm. The primary electron beam deflected by the ExB filter 8 is reduced, for example, by a factor of five by an electrostatic lens 11, and illuminated onto the sample 9. In this event, the primary electron beam has irradiation energy of 3 keV, for example, on the surface of the sample 9.

Secondary electrons emitted from the sample 9 irradiated with the primary electron beam include information on a pattern formed on the surface of the sample 9. The secondary electrons are enlarged by three electrostatic lenses 11, 12, 13 and enters a detector D to form a two-dimensional image on a microchannel plate 14. Subsequently, the secondary electrons multiplied by the microchannel plate 14 are converted into luminescence by a fluorescent plate 15, and the luminescence is led by a relay lens 16 to a TDI 17 which detects the light as an image, as previously described in connection with FIG. 1. Continuous travel of the wafer by x-y-θ stage 10 enables a line sensor such as a TDI to output an image of the wafer in the direction of the scan of the wafer.

The second and third electrostatic lenses 12, 13 are distortionless lenses because they make up a symmetric tablet lens. However, since slight distortions can occur due to stains on the electrodes and other components, an image generated from a standard pattern is preferably compared with an image generated from the sample 9 on a periodic basis for measuring distortions, such that a parametric voltage is calculated for correcting distortions and fed back to the electrostatic lenses 12, 13.

Figure 6:
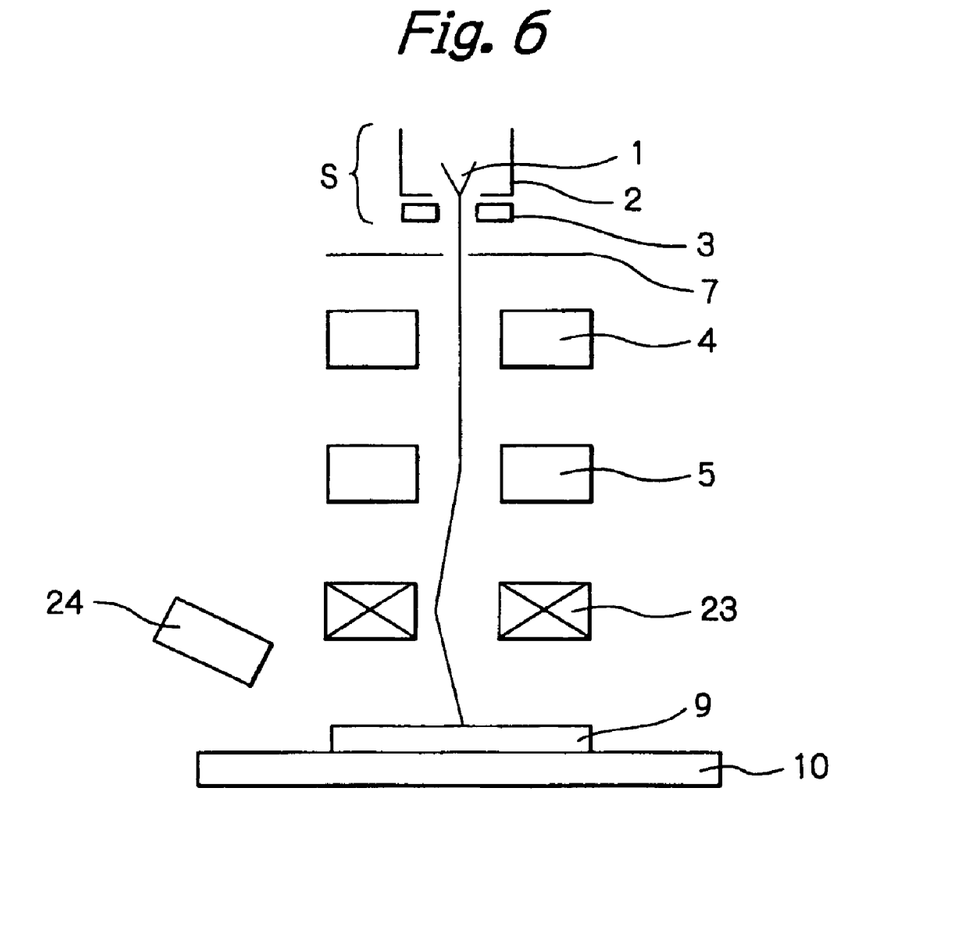
FIG. 6 is a diagram generally illustrating the configuration of a fifth embodiment of the electron beam apparatus according to the present invention.

As described above, an image generated by the secondary electrons emitted from the sample 9 is detected by the mapping projection type electron beam apparatus in the fourth embodiment. Alternatively, a scan type electron beam apparatus can be used instead. FIG. 6 generally illustrates an exemplary scan type electron beam apparatus for use in detecting such images. In FIG. 6, a primary electron beam emitted from a cathode 1 is accelerated by an anode 3, reshaped to a spot like shape by a first electrostatic lens 4 and then irradiated to a sample 9 through a second electrostatic lens 5 and a scan coil 23. The second electrostatic lens 5 and scan coil 23 set a scaling factor for the primary electron beam on the surface of the sample 9, and the primary electron beam is scanned on the surface of the sample 9 by the scan coil 23.

Secondary electrons, back-scattered electron beam, or reflected electrons emitted from the sample 9 irradiated with the first electron beam are detected by an electron detector 24 such as a photomultiplier, thereby permitting acquisition of a two-dimensional image generated by the secondary electrons. Then, possible defects are detected on the pattern formed on the sample 9 by using the two-dimensional image thus acquired for each die or by comparing image data.

Figure 7:
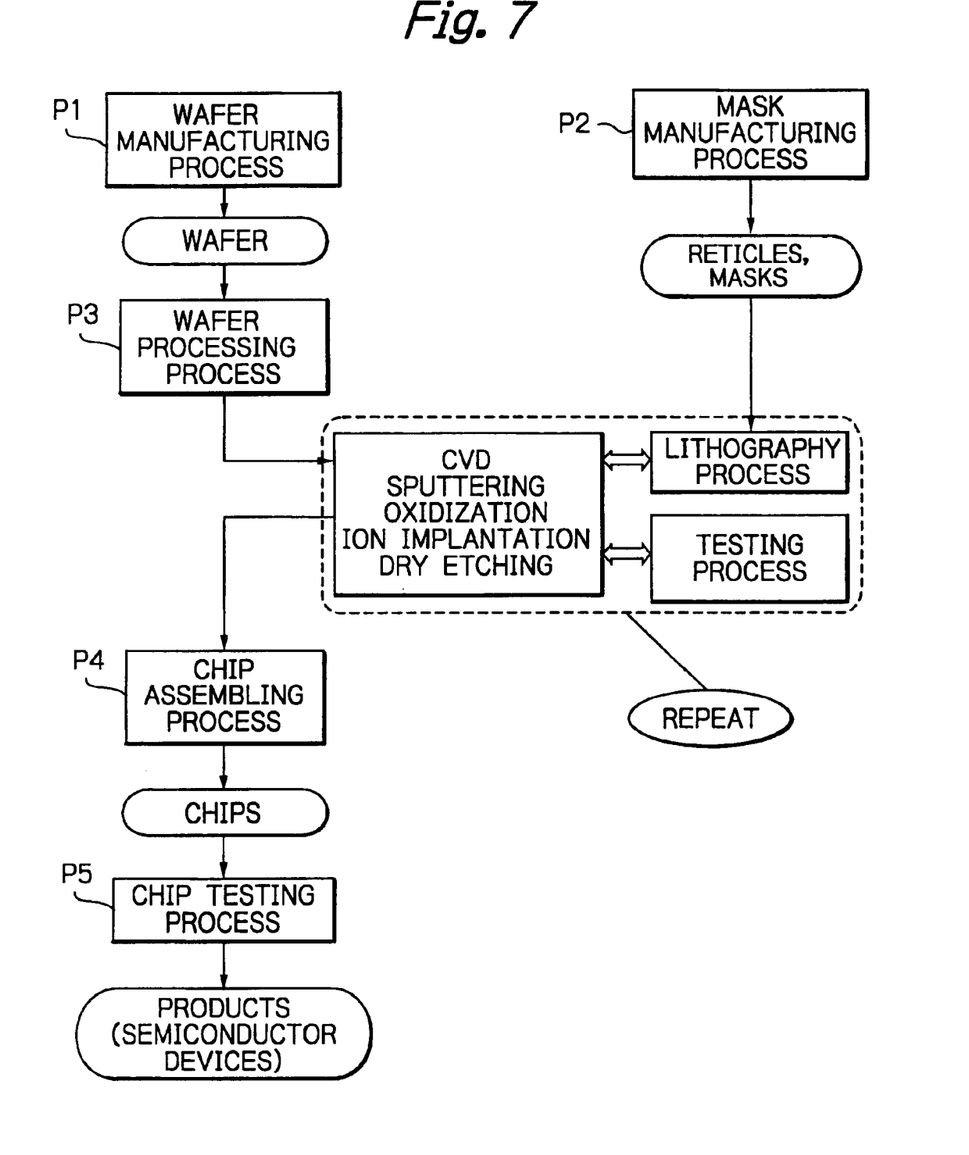
FIGS. 7 and 8 are flow chart illustrating main processes performed in an exemplary semiconductor device manufacturing method.

While several embodiments have been described for the electron beam apparatus according to the present invention, the electron beam apparatuses are suitable for use in the manufacturing of semiconductor devices. FIG. 7 is a flow chart illustrating main processes performed in an exemplary semiconductor device manufacturing method. This exemplary manufacturing method includes the following five main processes:

a wafer manufacturing process P1 for manufacturing wafers (or preparing wafers);

a mask manufacturing process P2 for manufacturing masks for use in exposure (or a mask preparing process for preparing masks);

a wafer processing process P3 for performing required processing on the wafer;

a chip assembling process P4 for dicing the wafer into individual chips and making each chip operable; and a chip testing process P5 for testing the finished chips.

Each of these processes includes several sub-processes. Among these processes, the wafer processing process P3 exerts a deterministic influence on the performance of semiconductor devices. In this wafer processing process P3, designed circuit patterns are laminated in sequence on a wafer to form a multiplicity of chips which may operate as a memory or a microprocessor unit.

As indicated by a dotted line frame, the wafer processing process P3 includes the following sub-processes:

(1) a thin film forming process for forming dielectric thin films which serve as an insulating layer, a metal thin film for forming wires or electrodes, and the like (using CVD, sputtering and the like);

(2) an oxidizing process for oxidizing the thin film layers and a wafer substrate;

(3) a lithography process for forming a resist pattern using masks (reticles) for selectively processing the thin film layers, wafer substrate and the like;

(4) an etching process for processing the thin film layers and wafer substrate in accordance with the resist pattern (using, for example, a dry etching technique);

(5) an ion/impurity injection and diffusion process;

(6) a resist removing process; and (7) a testing process for testing the processed wafer.

The wafer processing process P3 is repeatedly executed as many times as a number of required layers in order to manufacture semiconductor devices which operate as designed.

Figure 8:
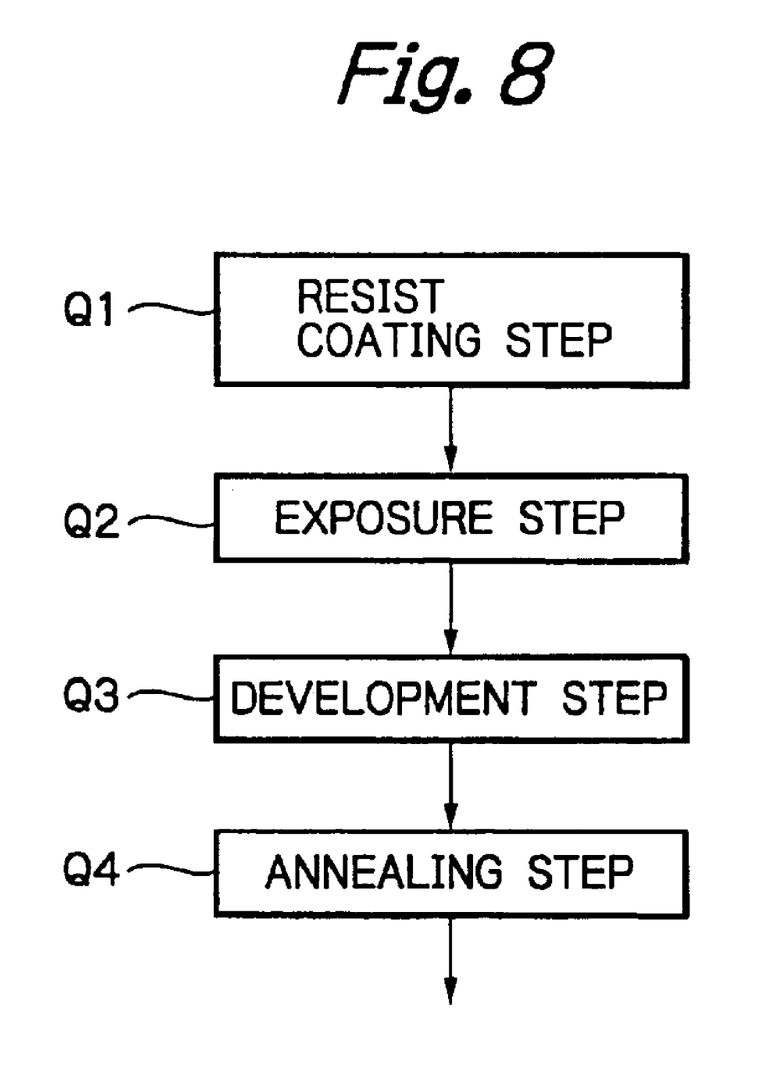

FIG. 8 is a flow chart illustrating the lithography process which is the core of the wafer processing process P3 in FIG. 7. As illustrated in FIG. 8, the lithography process includes:

a resist coating step Q1 for coating a resist on the wafer formed with circuit patterns by CVD or sputtering;

an exposure step Q2 for exposing the resist;

a developing step Q3 for developing the exposed resist to create a resist pattern; and an annealing step Q4 for annealing the developed resist pattern for stabilization.

Since the semiconductor device manufacturing process S1, wafer processing process S3 and lithography step are well known in the art, description thereon is omitted here.

The defect detecting apparatus according to the present invention, when applied to the aforementioned testing process (7), permits inspecting on even those semiconductor devices which have ultra fine patterns with high throughput, thereby providing for a total inspection, increasing the yield rate for products, and preventing shipment of defective products.

As will be understood from the description on several embodiment of the electron beam apparatus according to the present invention, the present invention is particularly advantageous in that a uniform potential can be provided over the surface of a sample, an electron image can be acquired with less aberration and distortion using an electron beam emitted from the surface of the sample, and defects can be picked up from the surface of the sample with an improved reliability.

What is claimed is:

1. An electron beam apparatus comprising:

an electron beam source for irradiating a sample with a primary electron beam, said sample including a pattern structure on the surface consisting of complex materials including a mixture of a metal and an insulating material;

an optical mapping system for imagining secondary electrons emitted from the surface of said sample irradiated with the primary electron beam;

a detector for detecting said secondary electrons; and an image processing system for processing a signal from said detector to compare an image with an adjacent image and form an electron image, thereby detecting defects for classification and discrimination, wherein said primary electron beam is optimized to have a beam energy in a range of 2 to 4 KeV, thereby reducing a secondary electron emission efficiency from the sample to less than one and causing the sample to be negatively charted to reduce image distortions, and wherein said electron beam source illuminates the sample before a material inspection to reduce potential difference between said metal material and insulating material.

2. An electron beam apparatus according to claim 1, wherein said beam energy in the range of 2 to 4 KeV is to negatively charge an insulating material on the surface of said sample to reduce overcharging.

3. An electron beam apparatus according to claim 1, wherein said optical system includes at least one electrostatic lens to which a parametric voltage for correcting a distortion is fed back, said parametric voltage being calculated by comparing a reference image with images obtained from said sample.

4. An electron beam apparatus according to claim 1, wherein said image processing system selects a representative point from a pattern edge to correct distortion by comparing an image obtained from the representative point with a reference image.

5. An electron beam apparatus comprising:

an electron beam source for irradiating a sample with a primary electron beam, said sample including a pattern structure on the surface consisting of complex materials including a mixture of a metal and an insulating material;

an optical mapping system for focusing secondary electrons emitted from the surface of said sample irradiated with the primary electron beam;

a detector for detecting said secondary electrons; and an image processing system for processing a signal from said detector to compare an image with an adjacent image and form an electron image, thereby detecting defects for classification and discrimination, wherein said primary electron beam is optimized to have a beam energy in a range of 2 to 4 KeV to negatively charge an insulating material on the surface of said sample to reduce overcharging, and wherein said electron beam source illuminates the sample before a material inspection to reduce potential difference between samples on a wafer.

6. An electron beam apparatus according to claim 5, wherein said optical mapping system has a resolution equal to or less than 0.1 μm, and a maximum image area equal to or less than 500 μm in a field of view.

7. An electron beam apparatus according to claim 5, further comprising a separating device for separating said primary electron beam from said secondary electrons.

8. An electron beam according to claim 7, wherein said separating device is an ExB filter.

9. An electron beam apparatus according to claim 5, wherein said detector includes a line sensor.

10. An electron beam apparatus according to claim 9, wherein said line sensor is such a line sensor having a function of signal averaging by electron charge accumulation as a TDI.

11. An electron beam apparatus according to claim 5, further comprising a coherent or incoherent light source lamp for irradiating said sample, said light source lamp including a laser for increasing the conductivity effect on the surface of the sample to improve the difference in surface potential between the metal and insulating material.

12. An electron beam apparatus according to claim 11, wherein said coherent light from said light source lamp has a wavelength band of 300 to 600 nm or less.

13. An electron beam apparatus according to claim 11, wherein said coherent light from said light source lamp has an irradiation density equal to or larger than 1 W/cm2.

14. A semiconductor device manufacturing method comprising the step of inspecting a wafer under processing in order to detect defects using an electron beam apparatus according to claim 5.

15. An electron beam apparatus according to claim 5, further comprising a second electron source for irradiating the surface of the sample with an electron beam whose irradiating energy can be controlled in a range of 0 to 4 KeV.

16. A method of detecting defects on a sample for classification and discrimination, comprising:

irradiating said sample with an electron beam emitted from an electron beam source, said sample including a pattern structure on the surface consisting of complex materials including a mixture of a metal and an insulating material;

imaging secondary electrons emitted from the surface of said sample irradiated with the primary electron beam;

detecting said secondary electrons by a detector; and processing a signal from said detector to compare an image with adjacent one and form an electron image, thereby detecting defects for classification and discrimination;

wherein said primary electron beam is optimized to have a beam energy in a range of 2 to 4 KeV, thereby reducing a secondary electron emission efficiency from the sample to less than one and causing the sample to be negatively charged to significantly reduce image distortions, and wherein said electron beam source illuminates the sample before a material inspection to reduce potential difference between said metal material and insulating material.

17. A method of detecting defects on a sample for classification and discrimination, comprising:

irradiating said sample with a primary electron beam emitted from an electron beam source, said sample including a pattern structure on the surface consisting of complex materials including a mixture of a metal and an insulating material;

focusing secondary electrons emitted from the surface of said sample irradiated with the primary electron beam;

detecting said secondary electrons by a detector; and processing a signal from said detector to compare an image with adjacent one and form an electron image, thereby detecting defects for classification and discrimination;

wherein said primary electron beam is optimized to have a beam energy in a range of 2 to 4 KeV to negatively charge an insulating material on the surface of said sample to reduce overcharging, and wherein said electron beam source illuminates the sample before a material inspection to reduce potential difference between said metal material and insulating material.

* * * * *